United States Patent
Stokkermans et al.

(10) Patent No.: US 10,104,784 B2
(45) Date of Patent: Oct. 16, 2018

(54) METHOD FOR MAKING AN ELECTRONIC PRODUCT WITH FLEXIBLE SUBSTRATE

(71) Applicant: NXP B.V., Eindhoven (NL)

(72) Inventors: Jozep Petrus Wilhelmus Stokkermans, Njimegen (NL); Thomas Markus Kampschreur, Arnhem (NL); Theodorus Ter Steeg, Eindhoven (NL); Patrick J. M. Houben, Helden (NL)

(73) Assignee: NXP B.V., Eindhoven (NL)

( * ) Notice: Subject to any disclaimer, the term of this patent is extended or adjusted under 35 U.S.C. 154(b) by 156 days.

(21) Appl. No.: 15/254,124

(22) Filed: Sep. 1, 2016

(65) Prior Publication Data

US 2017/0135224 A1  May 11, 2017

Related U.S. Application Data

(63) Continuation-in-part of application No. 14/935,185, filed on Nov. 6, 2015, now Pat. No. 9,994,407.

(51) Int. Cl.
| | | |
|---|---|---|
| *H05K 3/00* | (2006.01) | |
| *H05K 3/22* | (2006.01) | |
| *B65H 20/18* | (2006.01) | |

(52) U.S. Cl.
CPC .............. *H05K 3/22* (2013.01); *B65H 20/18* (2013.01); *B65H 2301/5143* (2013.01); *B65H 2406/33* (2013.01); *B65H 2406/334* (2013.01); *B65H 2406/342* (2013.01); *B65H 2513/104* (2013.01); *B65H 2701/1942* (2013.01); *Y10T 29/49124* (2015.01)

(58) Field of Classification Search
CPC ......... H01L 21/67173; H01L 21/67727; H01L 21/677; H01L 2924/00013; Y10S 414/135; Y10S 29/49124; B65H 2701/1942
USPC .......... 29/829, 729, 739, 742, 827, 832, 854
See application file for complete search history.

(56) References Cited

U.S. PATENT DOCUMENTS

| | | |
|---|---|---|
| 3,489,325 A | 1/1970 | Epstein et al. |
| 4,326,656 A | 4/1982 | Gregory et al. |
| 5,685,471 A | 11/1997 | Taubenberger |
| 5,779,184 A | 7/1998 | Kaufmann et al. |

(Continued)

FOREIGN PATENT DOCUMENTS

| | | |
|---|---|---|
| CH | 325428 | 11/1957 |
| EP | 1721750 A1 | 11/2006 |

(Continued)

OTHER PUBLICATIONS

Non-final office action dated Sep. 13, 2017 in U.S. Appl. No. 14/935,185.

(Continued)

*Primary Examiner* — Thiem Phan

(57) ABSTRACT

A method for making an electronic product. The method includes processing a flexible substrate (e.g., a web) with the use of a tensioner having a vacuum plate and an indexer that intermittently moves the flexible substrate for processing. While a designated location of the flexible substrate is stopped at a processing location, a process is performed on the designated location. Wherein while the designated location is stopped at the processing location, the vacuum plate of the tensioner moves in an opposite direction of the transport direction.

21 Claims, 12 Drawing Sheets

(56) References Cited

U.S. PATENT DOCUMENTS

| | | | |
|---|---|---|---|
| 6,003,420 A | 12/1999 | Wakabayashi et al. | |
| 6,621,157 B1 * | 9/2003 | Wirz | H01L 21/563 156/105 |
| 6,821,375 B2 * | 11/2004 | Ulrich | H01L 21/67144 156/285 |
| 2007/0137031 A1 | 6/2007 | Bosch et al. | |
| 2008/0061275 A1 | 3/2008 | Stokkermans | |
| 2010/0223767 A1 | 9/2010 | Vianen et al. | |
| 2011/0120756 A1 | 5/2011 | Ambo et al. | |

FOREIGN PATENT DOCUMENTS

| | | |
|---|---|---|
| GB | 2067524 A | 7/1981 |
| JP | 2000235267 A | 8/2000 |
| WO | 2010082441 A1 | 7/2010 |
| WO | 2013186745 A2 | 12/2013 |

OTHER PUBLICATIONS

Final office action dated Dec. 5, 2017 in U.S. Appl. No. 14/935,185.
Notice of Allowance dated Mar. 29, 2018 in U.S. Appl. No. 14/935,185.
"Web Guiding Systems ELGUIDER"; http://www.erhardt-leimen.com/index/Grossbritannien/GB+web+Guiding+Systems+ELGUIDER—1799.html; retrieved from the internet Nov. 8, 2015.

* cited by examiner

METHOD FOR MAKING AN ELECTRONIC PRODUCT WITH FLEXIBLE SUBSTRATE

CROSS-REFERENCE TO RELATED APPLICATIONS

This application is a continuation-in-part of U.S. application Ser. No. 14/935,185, filed on 6 Nov. 2015, having common inventors, entitled "SYSTEM AND METHOD FOR PROCESSING A FLEXIBLE SUBSTRATE," the contents of which are incorporated by reference in its entirety herein.

BACKGROUND

Certain types of electronic products may be manufactured on flexible substrates, such paper or plastic substrates (e.g., polymer textile carriers), which is sometimes referred to as a "web". Using such a web allows the electronic products to be manufactured in high volume and in an efficient manner. In most common web applications, the web is transported continuously through a web processing system. However, in some web applications, the web may need to intermittently stopped within the web processing system to perform some processing operation on the web. For these types of web applications, accurate positioning of the web for repeated execution of the processing operation when the web is temporarily stopped is very important. However, varying friction between the web and components of the processing system presents a significant challenge in achieving high precision accuracy of the web position within in the processing system.

SUMMARY

A processing system and a method for processing a flexible substrate (e.g., a web) use a tensioner with a vacuum plate that can be moved along a transport direction of the flexible substrate with an indexer that intermittently moves the flexible substrate for processing. The tensioner and the indexer are controlled so that a relative speed between the indexer and the vacuum plate of the tensioner is maintained above a predefined threshold under all working conditions, even when the flexible substrate is stopped.

A processing system in accordance with an embodiment of the invention comprises a tensioner with a vacuum plate configured to provide tension on a flexible substrate as the flexible substrate is transported over the vacuum plate along a transport direction, the vacuum plate being configured to be moved along the transport direction, an indexer configured to intermittently move the flexible substrate for processing, and a controller configured to control the tensioner and the indexer so that a relative speed between the indexer and the vacuum plate of the tensioner is maintained above a predefined threshold under all working conditions, even when the flexible substrate is stopped.

In an embodiment, the controller is configured to move the vacuum plate of the tensioner in the opposite direction of the transport direction when the indexer is stopped.

In an embodiment, the controller is configured to move the vacuum plate of the tensioner so that the relative speed between the indexer and the vacuum plate of the tensioner is maintained in a linear region of the Stribeck curve.

In an embodiment, the processing system further comprises a processing device that performs a process on the flexible substrate on the indexer when the indexer is stopped.

In an embodiment, the processing device is a pick-and-place device that places a device onto the flexible substrate.

In an embodiment, the indexer includes a drum with vacuum holes to move the web as the drum is rotated.

In an embodiment, the indexer is a linear indexer.

In an embodiment, the tensioner has a curved surface that can be moved in a rotational direction.

In an embodiment, the flexible substrate is made of paper, plastic or metal.

A processing system in accordance with another embodiment of the invention comprises a web tensioner with a vacuum plate configured to provide tension on a web as the web is transported over the vacuum plate along a transport direction, the vacuum plate being configured to be moved along the transport direction, a web indexer including a drum with vacuum holes, the drum being configured to be intermittently rotated to move the web, a processing device configured to process the web on the drum of the web indexer, and a controller configured to control the web tensioner and the web indexer so that a relative speed between the drum of the web indexer and the vacuum plate of the web tensioner is maintained above a predefined threshold under all working conditions, even when the web is stopped.

In an embodiment, the controller is configured to move the vacuum plate in the opposite direction of the transport direction when the drum of the web indexer is stopped.

In an embodiment, the controller is configured to move the vacuum plate of the web tensioner so that the relative speed between the drum of the web indexer and the vacuum plate of the web tensioner is maintained in a linear region of the Stribeck curve.

In an embodiment, the processing device is a pick-and-place device that places a device onto the web on the drum of the web indexer.

A method for processing a flexible substrate in accordance with an embodiment of the invention comprises supplying a flexible substrate to an indexer through a tensioner with a vacuum plate so that the flexible substrate is transported over the vacuum plate, intermittently moving the flexible substrate along a transport direction for processing, and moving the vacuum plate of the tensioner along the transport direction so that a relative speed between the indexer and the vacuum plate of the tensioner is maintained above a predefined threshold under all working conditions, even when the flexible substrate is stopped.

In an embodiment, the moving of the vacuum plate of the tensioner includes moving the vacuum plate of the tensioner in the opposite direction of the transport direction when the indexer is stopped.

In an embodiment, the moving of the vacuum plate of the tensioner includes moving the vacuum plate of the tensioner so that the relative speed between the indexer and the vacuum plate of the tensioner is maintained in a linear region of the Stribeck curve.

In an embodiment, the method further comprises performing a process on the flexible substrate on the indexer when the indexer is stopped.

In an embodiment, the processing of the flexible substrate includes placing a device onto the flexible substrate.

In an embodiment, the intermittently moving of the flexible substrate at the indexer includes rotating a drum with vacuum holes of the indexer to move the flexible substrate.

In an embodiment, the intermittently moving of the flexible substrate at the indexer includes linearly moving the flexible substrate at the indexer.

In one embodiment, a method for making an electronic product includes supplying a flexible substrate to an indexer through a tensioner with a vacuum plate so that the flexible substrate is transported over the vacuum plate, moving by the indexer, a designated location of the flexible substrate along a transport direction for processing to a processing location, and stopping the designated location of the flexible substrate at the processing location. The method also includes while the designated location is stopped at the processing location, performing a process on the designated location, and while the designated location is stopped at the processing location, moving the vacuum plate of the tensioner in an opposite direction of the transport direction. The method includes moving by the indexer, the designated location from the processing location after the performing the process and after the moving and forming an electronic product wherein the forming includes separating the web into a plurality of separate structures wherein the electronic product includes a separate structure of the plurality of separate structures with an electronic component.

In one embodiment, the performing the process includes placing the electronic component at the designated location, applying an adhesive at the designated location, or performing a curing process at the designated location. In some embodiments, the placing the electronic component at a designated location, applying an adhesive at the designated location, and performing a curing process at the designated location may be performed in making an electronic component.

In one embodiment, forming an electronic product includes applying a covering structure to the designated location after the performing the process. In one embodiment, forming an electronic product includes applying a covering structure before the separating.

In one embodiment, a method for making an electronic product includes supplying a flexible substrate to an indexer through a tensioner with a vacuum plate so that the flexible substrate is transported over the vacuum plate, moving by the indexer, a designated location of the flexible substrate along a transport direction for processing to a processing location, and stopping the designated location of the flexible substrate at the processing location. The method includes while the designated location is stopped at the processing location, placing an electronic component on the designated location, and while the designated location is stopped at the processing location, moving the vacuum plate of the tensioner in an opposite direction of the transport direction. The method includes moving by the indexer, the designated location from the processing location after the performing the process and after the moving and forming an electronic product wherein the forming includes separating the web into a plurality of separate structures wherein the electronic product includes a separate structure of the plurality of separate structures with the electronic component.

In one embodiment, an electronic product is made by the methods described herein.

Other aspects and advantages of embodiments of the present invention will become apparent from the following detailed description taken in conjunction with the accompanying drawings.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
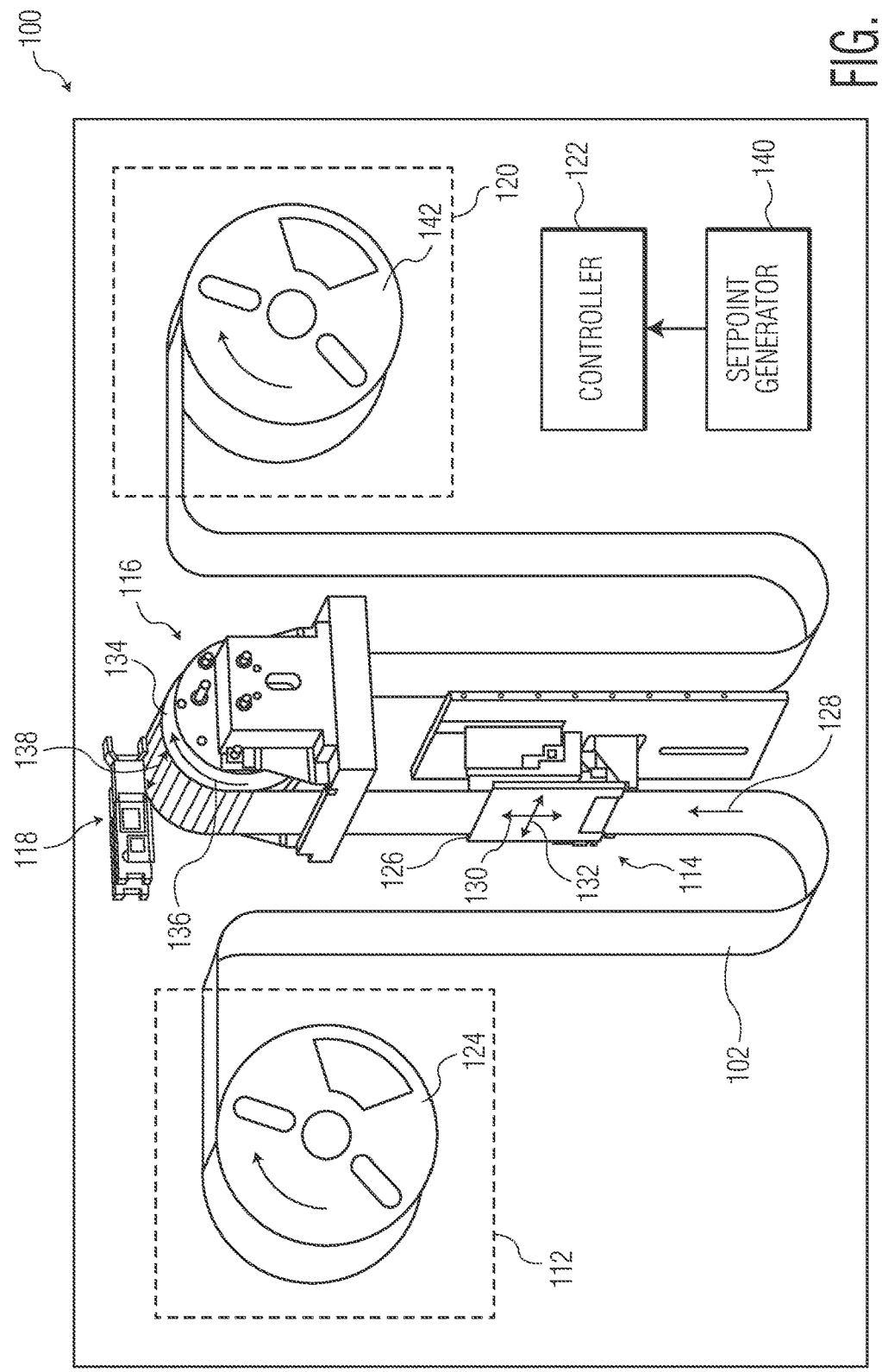
FIG. 1 is a schematic diagram of a processing system in accordance with an embodiment of the invention.

FIG. 1 shows a processing system 100 in accordance with an embodiment of the invention is shown. The processing system operates on a flexible substrate 102, which is referred to herein as a "web". The flexible substrate can be made of any flexible material. As an example, the flexible substrate may be, but not limited to, a long strip of paper, a long strip of polymer textile carrier or a long strip of flexible metal. In some applications, the web may include electrical structures or traces formed thereon. The processing system is designed to transport and guide the web through the processing system so that one or more processes can be performed on the web, such as pick-and-place process of integrated circuit (IC) chips or other electronic components onto the web. As described in more detail below, the processing system operates to transport the web through the processing system in a high precision manner.

Figure 2:
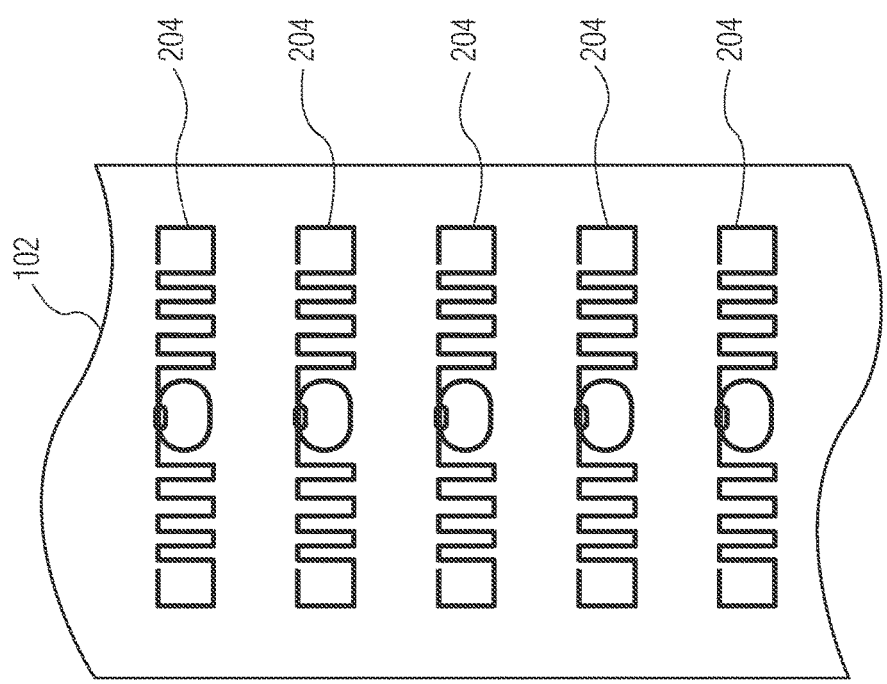
FIG. 2 show an example of a web that can be used in the processing system of FIG. 1.

An example of the web 102, which can be used in the processing system 100, is depicted in FIG. 2. As shown in FIG. 2, the web includes a number of electrical structures 204 that are separated from each other by some distance. These electrical structures can be any type of flexible electronics. These electrical structures are fabricated on the web prior to the web being processed by the processing system. In some applications, a device may need to be placed on each of the electrical structures at a precise location. Thus, accurately transporting the web through the processing system so that the device can be precisely placed at the designated placement location on the web is very important.

Turning back to FIG. 1, the processing system 100 includes a de-reeling unit 112, a web tensioner 114, a web indexer 116, a processing device 118, a reeling unit 120, and a controller 122. In FIG. 1, various support structures for the different components of the processing system are not shown in order to not obscure the inventive features of the system. As shown in FIG. 1, the web 102 is being processed by the processing system, and thus, is transported and guided through the various components of the processing system. In particular, the web is transported from the de-reeling unit to the reeling unit through the web tensioner and the web indexer so that the web can be processed by the processing device at the web indexer. The web tensioner, the web indexer and the processing device can be viewed as being a web processing set. In the illustrated embodiment, the processing system includes only one web processing set. However, in other embodiments, the processing system may include one or more additional web processing sets.

The de-reeling unit 112 of the processing system 100 operates to de-reel a roll of the web 102, which is typically rolled on a terminal reel 124, to be processed. The de-reeling unit supplies the web to the next module (i.e., the web tensioner 114) without tension. The de-reeling unit includes mechanisms to hold and rotate the terminal reel 124 so that the web can be de-reeled. These mechanisms can be commonly found in conventional processing systems, and thus, are not illustrated or described in detail herein.

Figure 3:
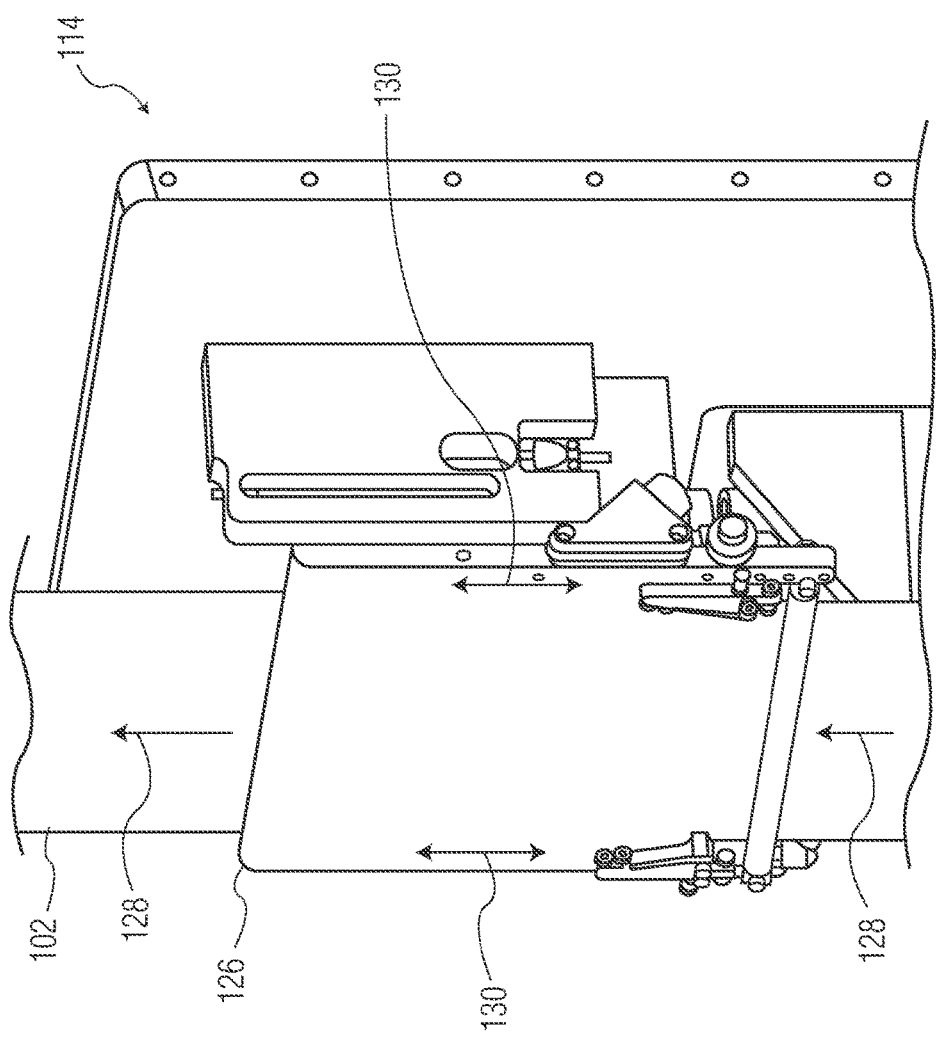
FIG. 3 is an enlarged view of a web tensioner of the processing system in accordance with an embodiment of the invention.

The web tensioner 114 of the processing system 100 operates to provide tension on the web 102 so that the movement of the web through the system, in particular, at the web indexer 116, can be controlled with high precision. In an embodiment, the web tensioner 114 includes a vacuum plate or table 126 that pulls or attracts the web using suction or negative gas pressure, as best shown in FIG. 3. The suction on the web from the vacuum plate provides tension on the web, while still allowing the web to move or travel along a transport direction, which is indicated by arrows 128. The vacuum plate includes a number of holes, which are connected to a vacuum pump (not show) that provides the suction. The vacuum plate is designed to move forward and reverse in the transport direction, as indicated by double arrows 130. As described in more detail below, a controlled movement of the vacuum plate allows the web to be transported and guided with high precision. In order for the vacuum plate to move, the vacuum plate is connected to one or more drive mechanisms, such as motors, that can displace the vacuum plate with desired velocity in the desired direction. In some embodiments, the vacuum plate is further designed to move in the lateral direction with respect to the transport direction, i.e., in the direction orthogonal to the transport direction, as indicated by a double arrow 132 (See FIG. 1), in order to control the lateral movement of the web. With sufficient tension on the web in the transport direction, the web will not significantly shift in the lateral direction when the web is indexed or moved by the web indexer 116. In the embodiment shown in FIGS. 1 and 3, the web tensioner includes the plate that has a flat surface for interfacing with the web. However, in other embodiments, the web tensioner may include a component with a curved surface for interface with the web, such as a drum. In these embodiments, the curved surface of the web tensioner may be moved in a rotational direction, rather than in a linear direction. In still other embodiments, the web tensioner may be implemented as one or more rollers that provide tension on the web.

The web indexer 116 of the processing system 100 operates to index or precisely transport the web 102 so that a specific location or spot of the web is displaced to a desired processing location. For example, the web can be moved so that a designated location on one of the electrical structures 204 (see FIG. 2) on the web is aligned with a particular position so that a device can be placed at the designated location. In the illustrated embodiment, the web indexer includes a circular drum 134 with multiple vacuum holes that pulls or attracts the web using suction or negative gas pressure, similar to the web tensioner 114. The suction on the web from the drum allows the drum to transport or move the web in the transport direction when the drum is rotated in the transport direction. The vacuum holes of the drum are connected to a vacuum pump (not show), which can be the same vacuum pump used for the web tensioner, that provides the suction. In some embodiments, the vacuum of the drum may differ from the vacuum of the vacuum plate 126 of the web tensioner. As an example, the vacuum of the vacuum plate may be less than the vacuum of the drum. The reason for difference is that the drum vacuum only needs to fix the web on the drum, and therefore, can be maximized. In contrast, the vacuum plate vacuum is used to create a certain hold force to create tension in the web when the web moves over the vacuum, and therefore, can be less than the drum vacuum. In order for the drum to be rotated, the drum is connected to one or more drive mechanisms, such as motors, that can rotate the drum in a controlled manner. In some embodiments, the drum is further designed to move in the lateral direction with respect to the transport direction, i.e., in the direction orthogonal to the transport direction, as indicated by a double arrow 138 in FIG. 1, in order to control the lateral movement of the web.

Figure 4:
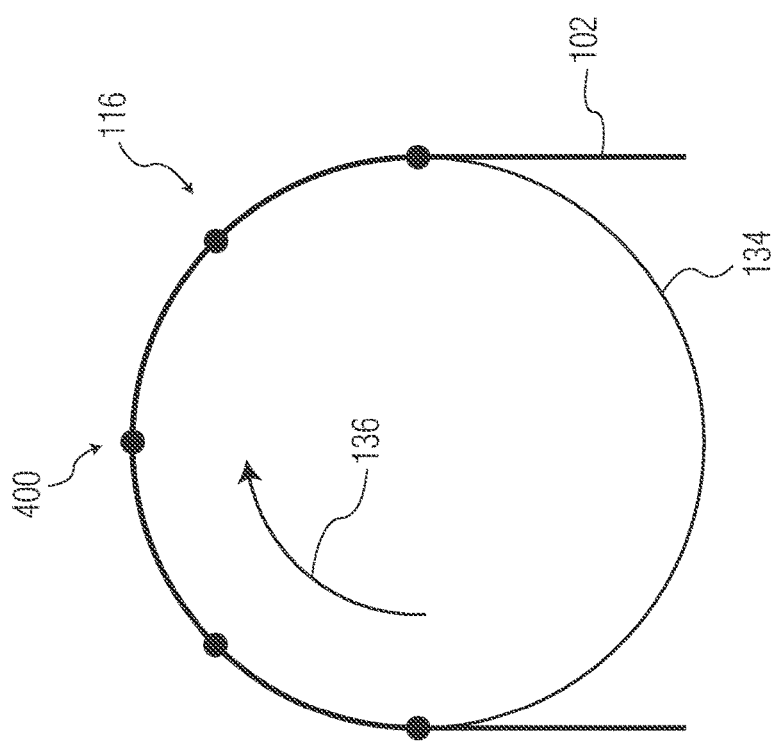
FIG. 4 illustrates the rotation of a drum of a web indexer of the processing system in accordance with an embodiment of the invention.

The web indexer 116 is able to index the web 102 (i.e., to transport the web over the pitch distance) by rotating the drum 134, which is illustrated in FIG. 4. As shown in FIG. 4, the drum of the web indexer is rotated in the clockwise direction that corresponds to the transport direction (indicated by an arrow 136), which also moves the web in the same direction. In this embodiment, the web is transported by the rotation of the drum so that a specific spot of the web, e.g., a die placement location on one of the antenna structures 204 (see FIG. 2), is moved to a process position 400 at a particular moment in time. In particular, the web is transported or moved intermittently by the drum so that the desired areas of the web can be sequentially stopped at the process position for processing. As an example, the web may be stopped and started several times per second. In order for the desired areas of the web to be stopped at the process position at the right moments in time, the web must be accurately transported by the drum.

Figure 5:
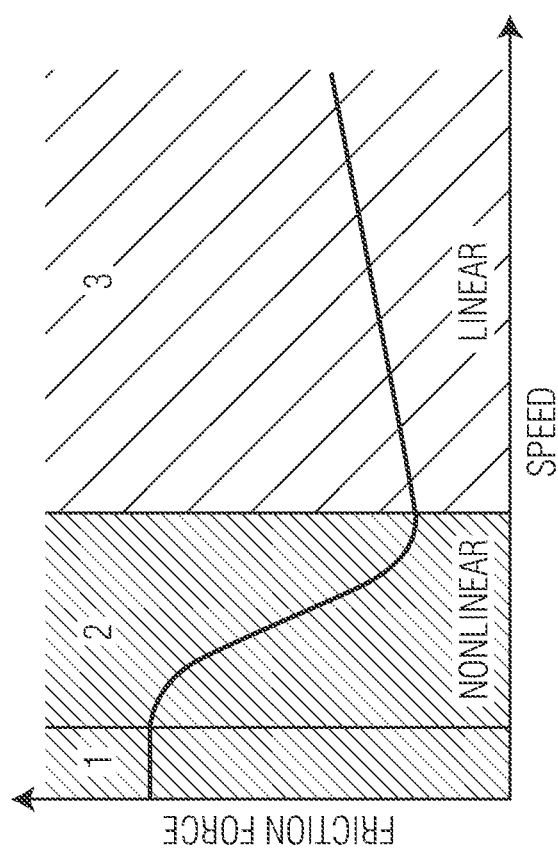
FIG. 5 shows a Stribeck curve with nonlinear and linear zones.

Accurate transport of the web 102 can be obtained by accurate position measurement of the web and accurate control of the web indexer 116. Accurate control of the web indexer position can be obtained by means of high bandwidth control loops and accurate feed forward. Feed forward compensates for known forces such as acceleration forces and frictional forces. However, frictional forces are difficult to compensate because the frictional force depends on speed in a quite complex fashion, as defined by the Stribeck curve, which is shown in FIG. 5. The Stribeck curve shows that frictional force at low speeds (zones 1 and 2 in FIG. 5) is quite nonlinear and non-reproducible. Above a certain speed, however, the frictional force is quite linear with speed (zone 3 in FIG. 5).

Figure 6:
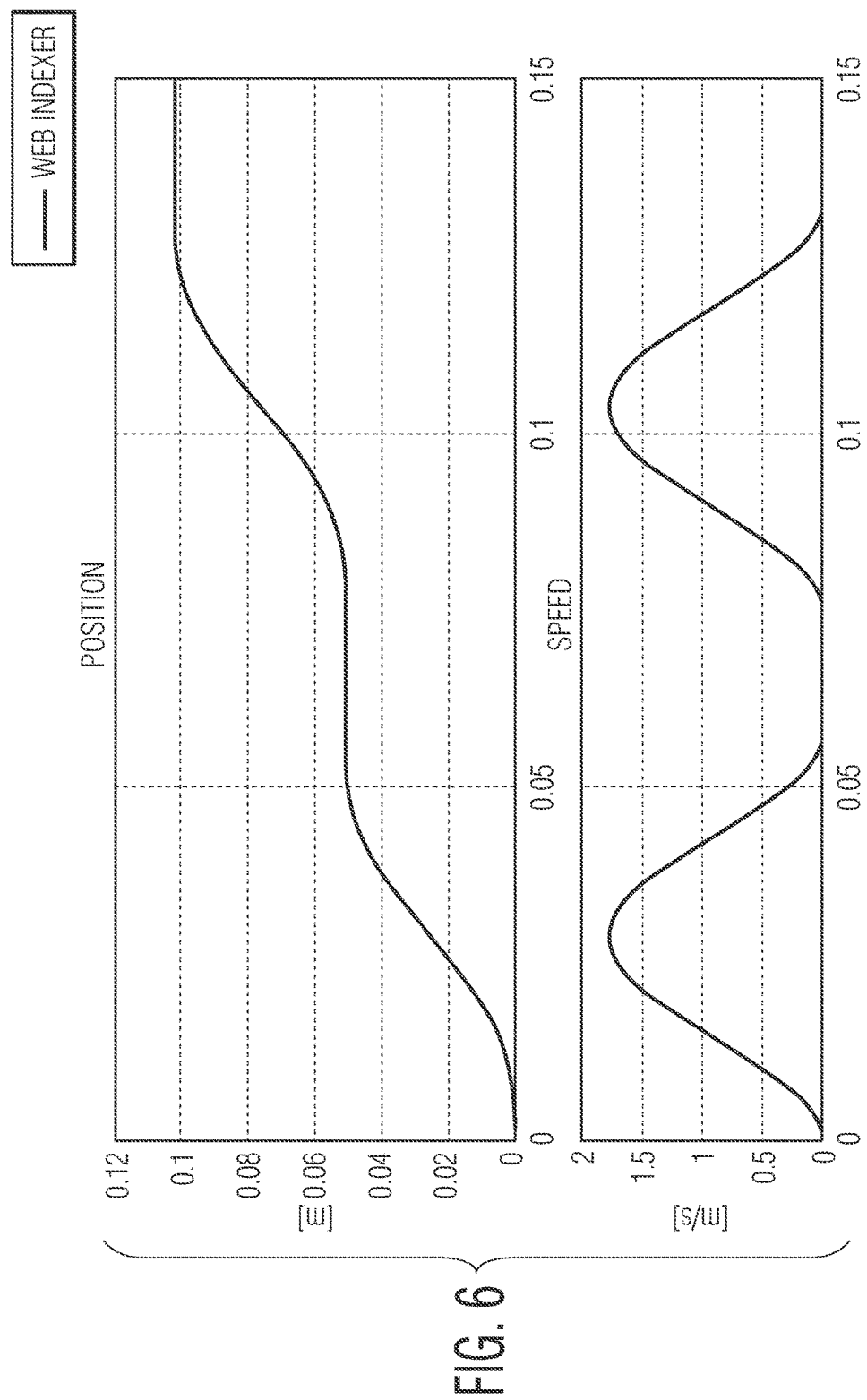
FIG. 6 is graph showing position and speed of the web indexer when the web tensioner uses a static vacuum plate.

The frictional force that needs to be compensated by a feed forward depends on the relative speed between the speed of the web tensioner 114 and the rotational speed of the web indexer 116 (i.e., the speed of the drum surface). If the web tensioner uses a static vacuum plate, which is easiest to implement, the relative speed between the web tensioner and the web indexer would vary from zero to the maximum transport speed, as illustrated in FIG. 6. In this case, the frictional force would have a typical Stribeck behavior, which is difficult to compensate due to the non-repetitive behavior around zero speed, i.e., when the web indexer is stopped. That is, the web will initially stick to the web tensioner with high friction and then will switch to a lower friction after the web achieves a certain velocity with respect to the web tensioner.

In order to overcome this difficulty, the vacuum plate 126 of the web tensioner 114 is moved in the reversed transport direction with specific speed profile so that the relative speed between the web tensioner and the web indexer 116 can be kept at nonzero speeds. If the relative speed is nonzero above a certain threshold, the frictional force can be compensated with a simple predictable linear compensation yielding a better position accuracy in the end. That is, if the relative speed threshold is maintained in the linear zone of the Stribeck curve, i.e., zone 3 of the Stribeck curve, the compensation for the frictional force is much easier. Thus, when the drum 134 of the web indexer is stopped so that a process can be performed on the web, the vacuum plate of the web tensioner moves in the opposite direction of the transport direction to keep a constant velocity between the web and the vacuum plate. So when the drum of the web indexer starts to move again, the frictional force at the web tensioner is still in the linear zone of the Stribeck curve. If the frictional force at the web tensioner is maintained in the Stribeck linear zone when the drum of the web indexer is stopped, then accurate web position is much easier to achieve for the next cycle (i.e., when the web is stopped again) by the processing system 100.

Figure 7:
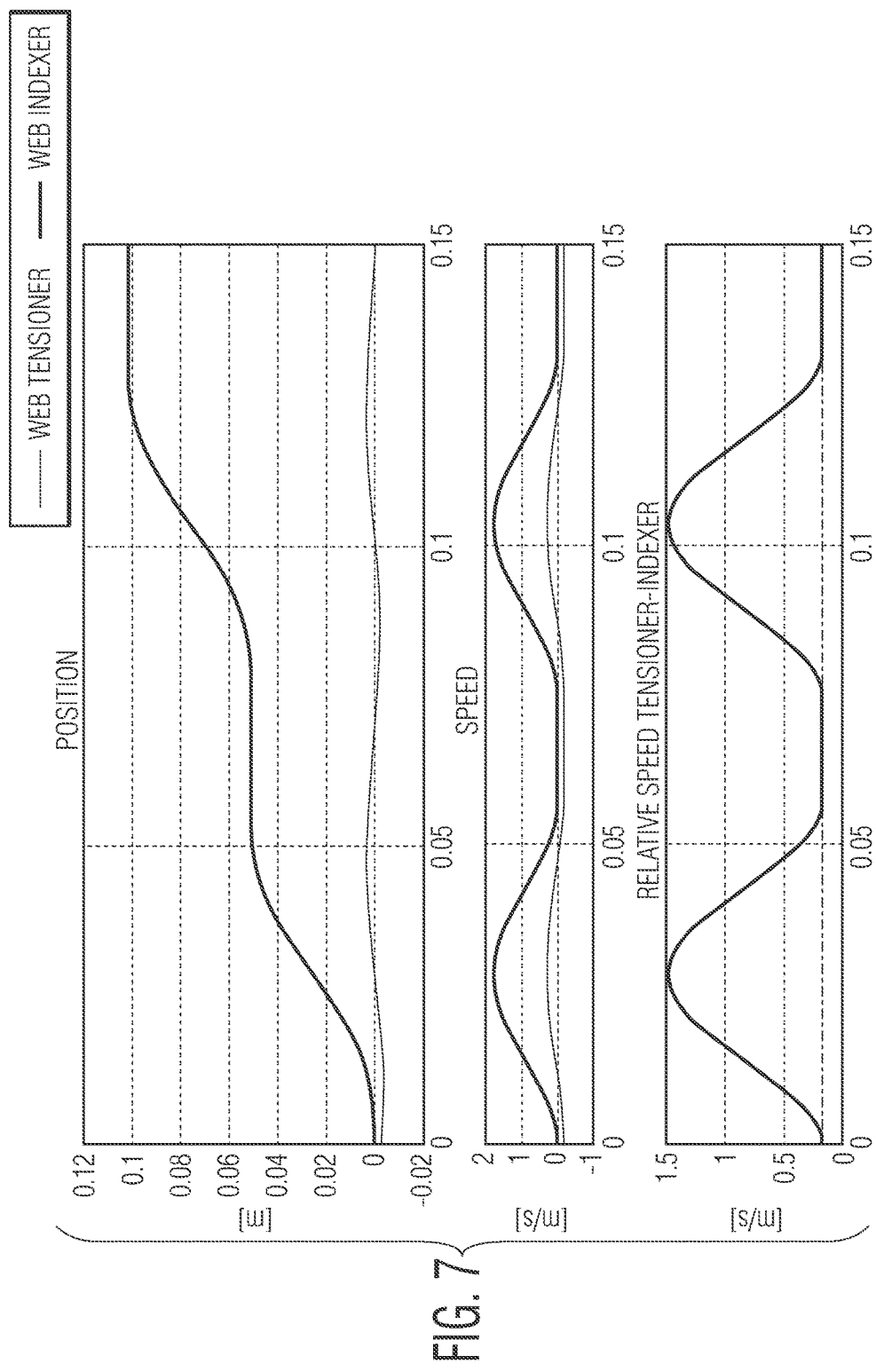
FIG. 7 is graph showing position and speed of the web indexer and the web tensioner when the web tensioner uses a movable vacuum plate in accordance with an embodiment of the invention.

In an embodiment, the processing system 100 includes a setpoint generator 140 that creates a motion profile for the vacuum plate 126 of the web tensioner 114, which is synchronous with the movements of the web indexer 116 (i.e., the rotational movement of the drum 134), in order to control the relative speed between the web tensioner and the web indexer. The motion profile is created such that the average speed of the web tensioner is zero and the speed of the web tensioner is lower than zero, i.e., moving in the negative transport direction, if the web indexer speed is zero. As used herein, the speed of the web tensioner refers to the speed of the vacuum plate 126 of the web tensioner and the speed of the web indexer refers to the rotational speed of the drum 134 of the web indexer. In addition, the motion profile is created such that the relative speed between the web indexer and the web tensioner is maintained above a certain threshold so that the frictional force between the web tensioner and the web is in the linear zone of the Stribeck curve, i.e., zone 3 of the Stribeck curve. FIG. 7 shows the relative speed between the web indexer and the web tensioner, which is maintained above the desired threshold speed, as well as the position and speed of the web indexer and the web tensioner.

Turning back to FIG. 1, the processing device 118 of the processing system 100 operates to process a device on the web 102 on the drum 134 of the web indexer 116. In particular, the processing device 118 processes the device to the process position 400 while the desired spot of web is moved to that process position, as shown in FIG. 4. In some embodiments, the processing device is a pick-and-place device that loads electronic components, such as IC chips, onto the desired spots of the web. However, in other embodiments, the processing device may be any processing device that can perform any process on the web at or near the web indexer.

The reeling unit 120 of the processing system 100 operates to reel the web 102, which has been processed by the processing device 118, onto another terminal reel 142. Similar to the de-reeling unit 112, the reeling unit includes mechanisms (not shown) to hold and rotate the terminal reel 142 so that the processed web can be reeled onto the terminal reel 142. After the entire web has been processed and reeled onto the terminal reel 142, the terminal reel with the processed web can be removed from the processing system.

The controller 122 of the processing system 100 operates to control the various components of the system, including the de-reeling unit 112, the web tensioner 114, the web indexer 116, the processing device 118 and the reeling unit 120. In particular, the controller controls the speed or rotation of the web indexer, as well as the speed of the web tensioner. In some embodiments, the controller controls the relative speed between the web indexer and the web tensioner using the motion profile created by the setpoint generator 140. In an embodiment, the setpoint generator may be a computer program running on the controller. In other embodiments, the setpoint generator may be implemented in any combination of software, hardware and firmware. The controller may include one or more processors and/or one or more microcontrollers to process information and control the various components of the processing system.

Figure 8:
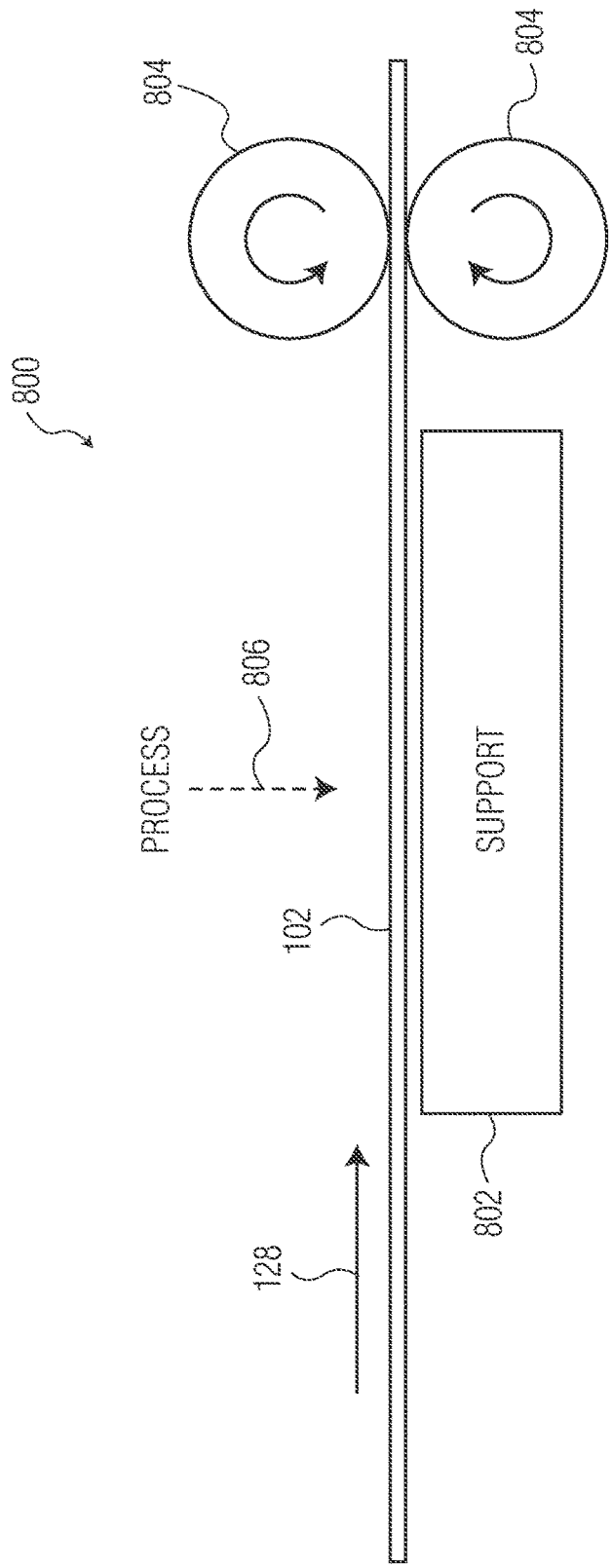
FIG. 8 is a diagram of a linear web indexer that can be used in the processing system in accordance with an embodiment of the invention.

In other embodiments, the web indexer 116 may be a different type of a web indexing device, such as a linear web indexer. FIG. 8 shows one example of a linear web indexer 800 that can be used in the processing system 100 instead of the web indexer 116. As illustrated, the linear web indexer includes a support structure 802 and a pair of rollers 804. The support structure 802 provides support for the web 102 as the web is transported linearly along the transport direction, as indicated by the arrow 128. The rollers 804 operate to intermittently move the web along the transport direction so that the web can be processed when each desired spot or area of the web is moved to a process position, as indicated by the dotted arrow 806. Other types of web indexing device that can accurately transport the web may be used in the processing system.

Figure 9:
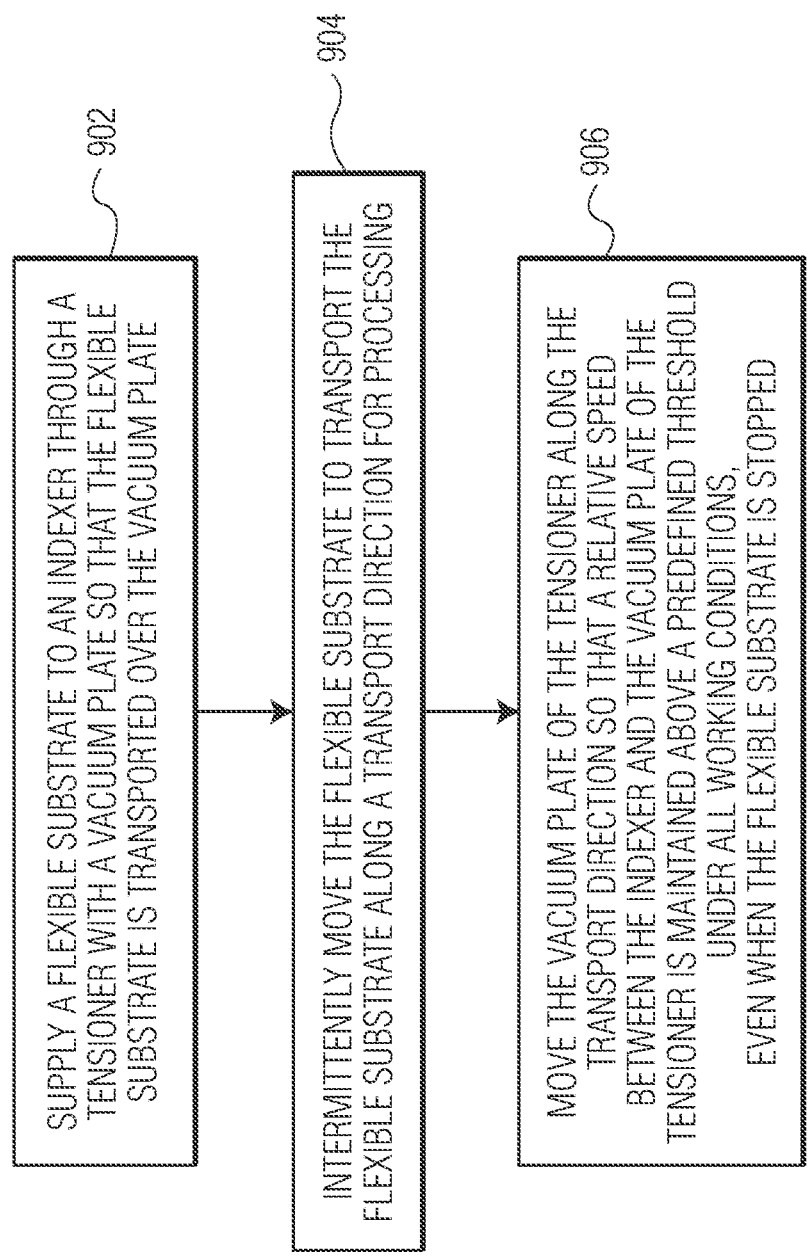
FIG. 9 is a process flow diagram of a method for processing a flexible substrate in accordance with an embodiment of the invention.

FIG. 9 is a process flow diagram of a method for processing a flexible substrate, such as the web 102, in accordance with an embodiment of the invention. At block 902, a flexible substrate is supplied to an indexer, such as the web indexer 116, through a web tensioner with a vacuum plate, such as the web tensioner 114, so that the flexible substrate is transported over the vacuum plate. At block 904, the flexible substrate is intermittently moved along a transport direction for processing. At block 906, the vacuum plate of the tensioner is moved along the transport direction so that a relative speed between the indexer and the vacuum plate of the tensioner is maintained above a predefined threshold under all working conditions, even when the flexible substrate, e.g., the web, is stopped.

Figure 10:
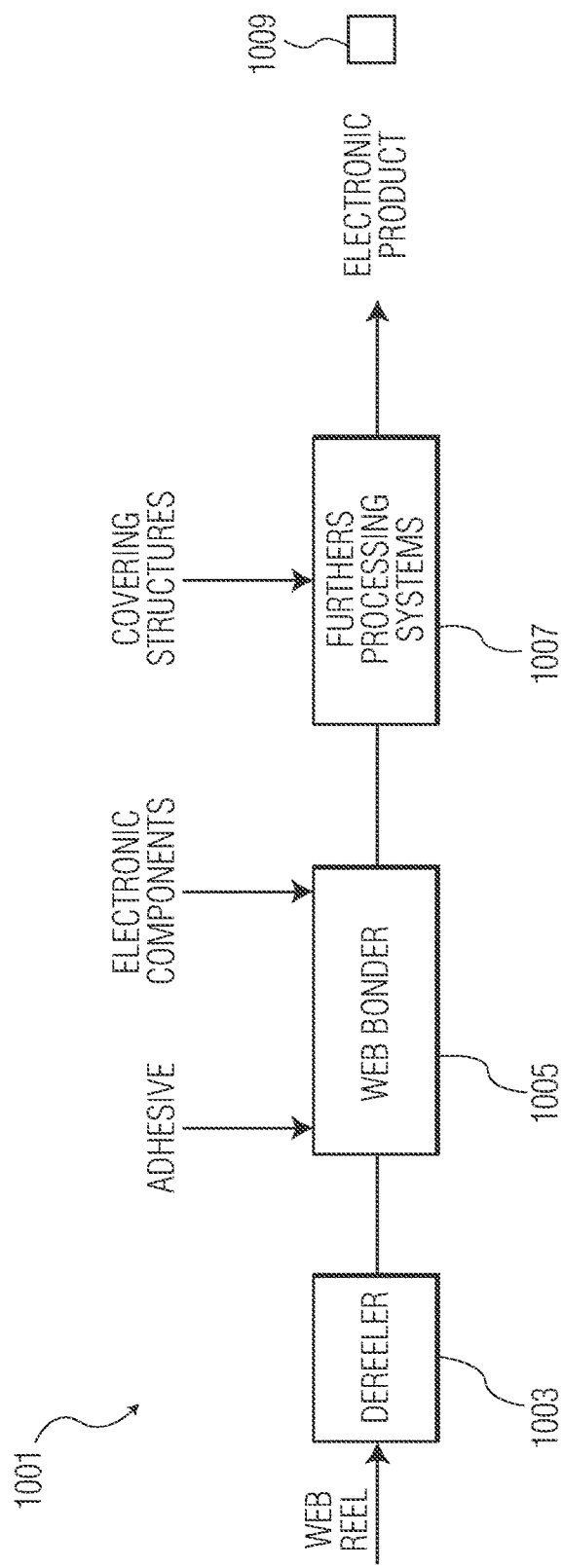
FIG. 10 is a block diagram of a processing system according to one embodiment of the present invention.

FIG. 10 is a block diagram of a processing system according to another embodiment of the present invention. Processing system 1001 is used to manufacture electronic products (e.g. cards, tags, labels, clothes) from a web. Processing system 1001 includes a de-reeling unit 1003, a web bonder 1005, and further processing systems 1007. De-reeling unit 1003 is similar to de-reeling unit 112 in that it operates to de-reel a roll of a web (e.g. 102) that is installed in de-reeling unit 1003.

Web bonder 1005 includes processing modules for, in one embodiment, applying adhesive to a web, applying an electronic component to the web, and curing the adhesive. Further processing systems 1007 include equipment for applying a covering structure (e.g. paper, plastic, fabric, encapsulant) to the web and for separating the web into electronic products (e.g. 1009). In some embodiments, further processing systems may include a printer for printing text and/or bar codes on the covering structures and a tester for testing the structures. In some embodiment, the web is provided directly to further processing systems 1007 without the use of a reel. However, in other embodiments, a reeling unit would be used to reel the web from web bonder 1005 where the reeled web would be provided to further processing systems 1007.

Figure 11:
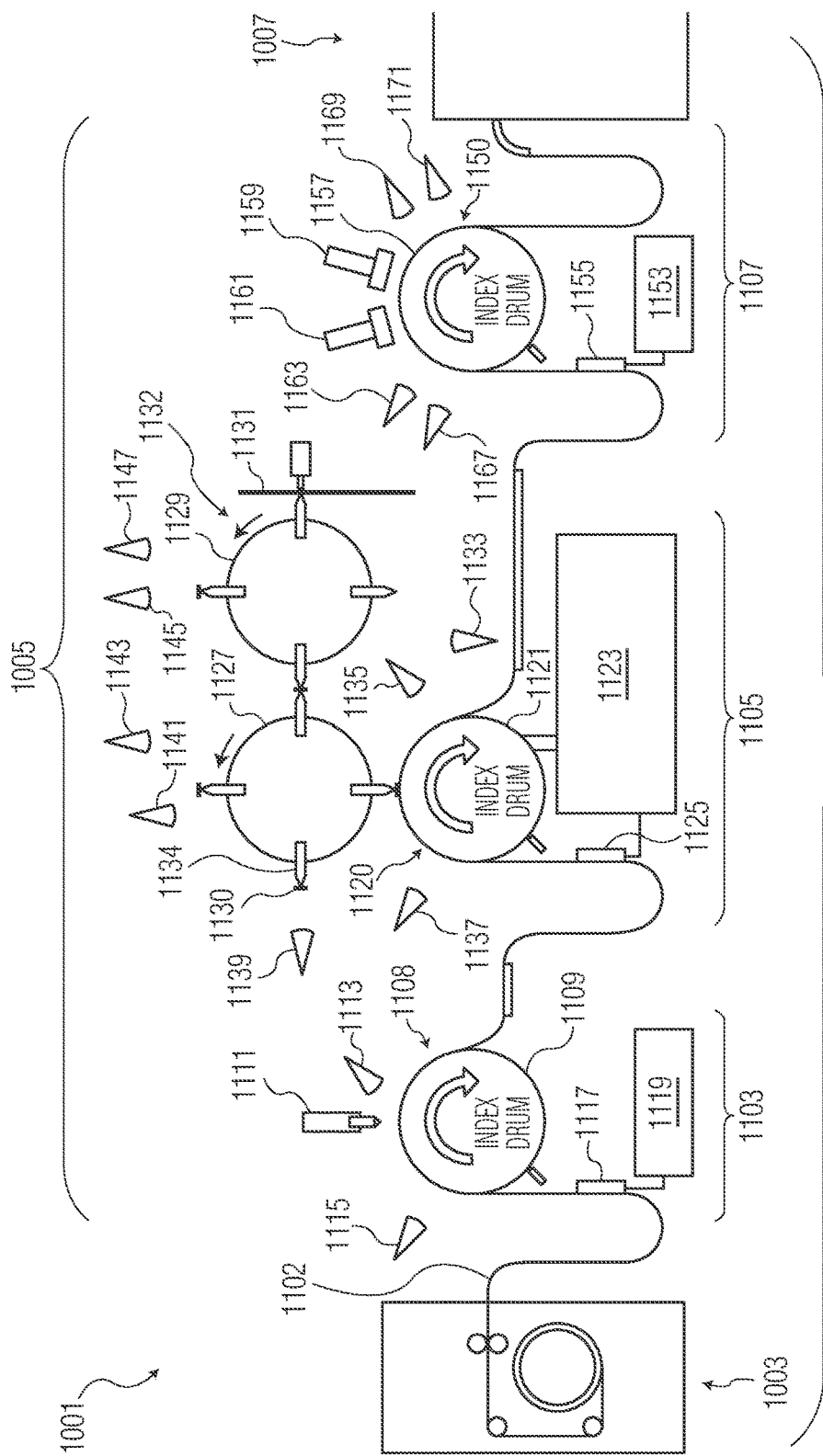
FIG. 11 is a schematic diagram of portion of processing system according to one embodiment of the present invention.

FIG. 11 is a schematic diagram of one embodiment of portion of processing system 1001 including a web bonder 1005. Web bonder 1005 includes an adhesive module 1103, a placement module 1105, and a curing module 1107.

Adhesive module 1103 includes an indexer 1108, an adhesive applicator 1111, a tensioner 117, and a controller 1119. Indexer 1108 includes an indexer drum 1109. In one embodiment, indexer 1108 is similar to indexer 116, tensioner 1117 is similar to tensioner 114, and controller 1119 is similar to controller 122. Also in one embodiment, web 1102 is similar to web 102. Adhesive applicator 1111 applies adhesive to designated locations of web 1102 for subsequent attachment of electronic components. The controller 122 controls the indexer 1108 and tensioner 1117 such that designated locations of web 1102 are stopped on drum 1109 at a desired processing location for the application of adhesive by applicator 1111 at the designated locations of the web. See the previous description on the control of indexer 116 and tensioner 114. Module 1103 also includes sensors 1115 and 1113 for providing positioning and quality information of the process to controller 1119.

Placement module 1105 receives the web 1102 from module 1103 and applies an electronic component 1130 to a designated location of web 1102. Module 1105 includes an indexer 1120, a tensioner 1125, and a controller 1123. Indexer 1120 includes an indexer drum 1121. In one embodiment, indexer 1120 is similar to indexer 116, tensioner 1125 is similar to tensioner 114, and controller 1123 is similar to controller 122.

Module 1105 also includes a pick and place device 1132 for retrieving integrated circuits (e.g. 1130) from wafer 1131 and placing them onto designated locations of web 1102. In the embodiment shown, device 1132 includes a pickup mill 1129 and an attachment mill 1127 that rotate in a counter clockwise direction (relative to the view shown in FIG. 11). Mills 1127 and 1129 each includes vacuum pipets (e.g. 1134) for carrying integrated circuits during the pick and place operations. Mill 1129 rotates to pick up integrated circuits from wafer 1131 and carry them to a handover location where mill 1127 takes the integrated circuits (e.g. 1130) and places them at designated locations of web 1102. During the placement of the integrated circuits, the designated locations of web 1102 are stopped on indexer drum at a desired processing location. See the previous description on the control of indexer 116 and tensioner 114. In other embodiments, module 1105 may include other types of pick and place machines.

Module 1105 includes a number of sensors used in controlling its operation. Sensor 1137 is used for alignment of web 1102. Sensor 1135 is used to evaluate the placement of an integrated circuit on the web 1102. Sensor 1133 is used to determine if pick-up mill 1129 adequately handed off an integrated circuit to attachment mill 1127. Sensor 1147 is used to align pick-up mill 1129. Sensor 1145 is used to check if the integrated circuit is in the correct position and orientation such that the hand-over can be performed properly. Sensor 1143 is used to determine if an integrated circuit was properly handed over to mill 1127. Sensor 1141 is used for the alignment of mill 1127. Sensor 1139 is used to inspect the integrated circuit (e.g. 1130). The sensors are operably coupled to controller 1123.

Curing module 1107 receives web 1102 from module 1105 and applies heat to the adhesive to cure the adhesive to more securely attach the electronic components to the web 1102 at the designated locations. Module 1107 includes an indexer 1150, a tensioner 1155, and a controller 1153. Indexer 1150 includes an indexer drum 1157. In one embodiment, indexer 1150 is similar to indexer 116, tensioner 1155 is similar to tensioner 114, and controller 1153 is similar to controller 122.

Module 1107 includes two thermodes 1161 and 1159 for applying heat to the adhesive at two designated locations of web 1102 for curing the adhesive. In the embodiment shown, each thermode (1161 and 1159) applies heat at a different processing location where adhesive at a designated location of web 1102 can be cured at the processing location. After the curing, the indexer 1150 moves web 1102 in the transport direction such that two new designated locations of web 1102 are moved to the two processing locations. In this manner, indexer 1150 moves web 1102 one half as often as indexers 1108 and 1120 in that module 1107 processes two designated locations of web 1102 at the same time. In other embodiments, other types of heating elements may be used and/or other types of curing processes may be implemented.

Afterwards, web 1102 is provided to further processing systems 1007 for further processing.

As stated above, in one embodiment, each module (1103, 1105, and 1107) includes an indexer (1108, 1120, and 1150), tensioner (1117, 1125, and 1155), and controller (119, 1123, and 1153) that is similar to indexer 116, tensioner 114, and controller 122. For example, the tensioner and the indexer of each module can be controlled so that a relative speed between the indexer and the vacuum plate of the tensioner is maintained above a predefined threshold under all working conditions, even when the flexible substrate is stopped. In one embodiment, the relative speed between the indexer and the vacuum plate of the tensioner can be maintained in a linear region of the Stribeck curve. In one embodiment, while a designated location is stopped at a processing location, a vacuum plate of the tensioner can be moved in an opposite direction of the transport direction.

In other embodiments, processing system 1001 may have other configurations. For example, system 1001 may include reeler and de-reeler units located between modules 1103, 1105, and/or 1107. Also in other embodiments, system 1001 may include other modules with an indexer and tensioner similar to indexer 116 and tensioner 114, respectively. For example, some systems may include two or more placement modules (similar to module 1105), where with each placement module, a different component is attached such that each electronic product includes more than one electronic component. In some embodiments, controllers 1119, 1123, and 1153 can be implemented as one controller. Some systems may include modules (with a tensioner and indexer) for implementing soldering or encapsulation processes. Some systems would not include a curing stage in that the adhesive would be self-curing or implements a solder process that does not require reflowing (e.g. such as with palladium bumps). In other embodiments, the modules may have other types of devices and/or have other types of configurations. For example, the modules may include components described earlier such as a linear web indexer. In some embodiments, controllers 1119, 1123, and 1153 include set point generators similar to set point generator 140. In other embodiments, modules 1103, 1105, and 1107 may include separate set point generators.

Figure 12:
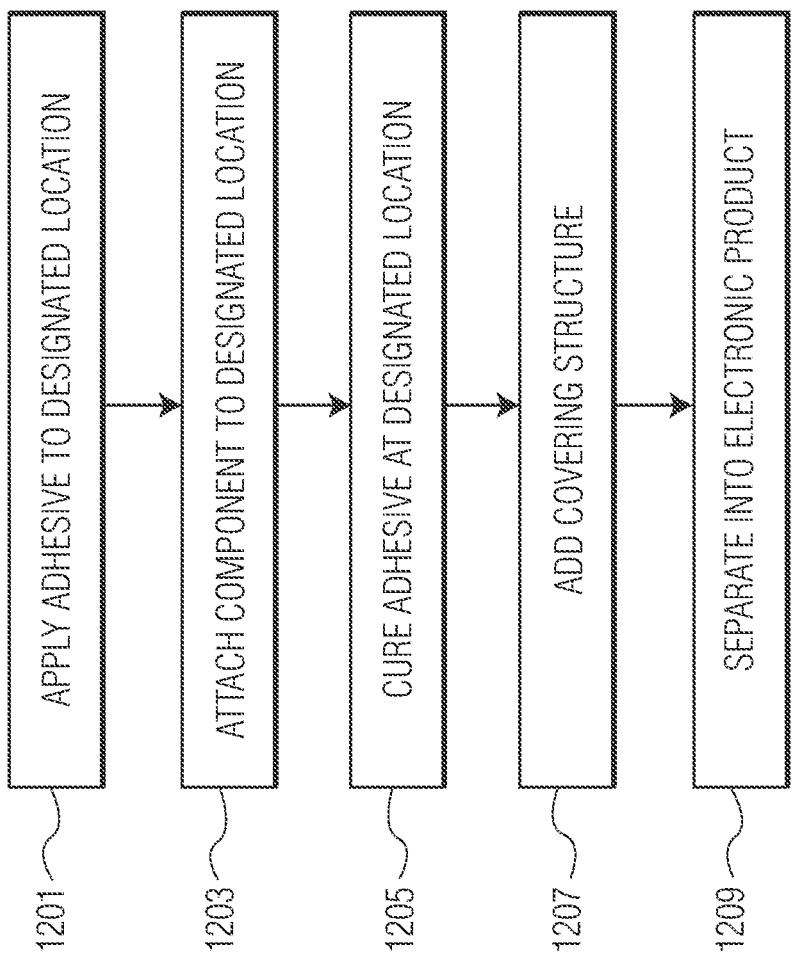
FIG. 12 is a flow diagram illustrating a method for forming an electronic product according to one embodiment of the present invention.

FIG. 12 is a flow diagram illustrating a method for forming an electronic product according to one embodiment of the present invention. In stage 1201, an adhesive is applied to a designated location of a web (e.g. 102, 1102). In one embodiment, the adhesive is applied by module 1103. In one embodiment, the adhesive is a glue. In other embodiments, the adhesive is a flux for soldering.

In stage 1203, an electronic component is attached to the web at a designated location where the adhesive was applied. In one embodiment, the electronic component is an integrated circuit. However, it can be another type of electronic component such as a stand-alone electronic component (capacitors, resistors, antennae, LEDs). In one embodiment, the component is applied by module 1105.

In stage 1205, the adhesive is cured. In one embodiment, the adhesive is cured by heat from a heating element, but may be cured by other methods in other embodiments. In embodiment where flux was applied as adhesive, the solder balls of the electronic component are reflowed to securely attach the electronic component to the web. In one embodiment, the solder balls can be attached with a thermal compression process. In one embodiment, the curing step is done by module 1107.

After the curing stage 1205, a covering structure is added to the web. In one embodiment, the covering structure is paper from a reel of paper. In other embodiments, the covering structure is plastic. Still in other embodiments, the covering structure is fabric. In some embodiments, the covering structure is applied to both sides of the web. In other embodiments, the covering structure is applied to only one side of the web. In some examples, the covering structure is supplied from a reel (or reels) and is attached with adhesive, heat, and/or compressive force. In some embodiments, the covering structure for each electronic product is separately applied to the web. In one embodiment, the application of the covering structure is performed by the further processing systems 1007.

After the application of the covering structure, further processes may be performed on the web such as label or bar code printing and testing. Afterwards, in stage 1209, the web is separated into electronic products (e.g. a smart card, label, tag, article of clothing, a product with an RFID component). Although the method of FIG. 12 is described as being performed by system 1001, it may be formed by other systems in other embodiments. Also the method of FIG. 12 may have other processes or processes arranged in different orders in other embodiments. For example, the separation of the web may be performed prior to the application of the covering structure.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for making an electronic product comprising:
   supplying a flexible substrate to an indexer through a tensioner with a vacuum plate so that the flexible substrate is transported over the vacuum plate;
   moving by the indexer, a designated location of the flexible substrate along a transport direction for processing to a processing location;
   stopping the designated location of the flexible substrate at the processing location;
   while the designated location is stopped at the processing location, performing a process on the designated location, wherein while the designated location is stopped at the processing location, moving the vacuum plate of the tensioner in an opposite direction of the transport direction;

moving by the indexer, the designated location from the processing location after the performing the process;

after the moving, forming an electronic product wherein the forming includes separating the web into a plurality of separate structures wherein the electronic product includes a separate structure of the plurality of separate structures with an electronic component.

2. The method of claim 1 wherein the performing the process includes placing the electronic component at the designated location.

3. The method of claim 2 wherein a pick and place device performs the placing the electronic component.

4. The method of claim 2 wherein the electronic component is characterized as an integrated circuit.

5. The method of claim 1 wherein the performing the process includes applying an adhesive to the designated location.

6. The method of claim 1 wherein the performing the process is characterized as performing a curing process at the designated location.

7. The method of claim 6 wherein the performing a curing process includes applying heat to the designated location.

8. The method of claim 1 wherein the forming an electronic product includes applying a covering structure to the designated location after the performing the process.

9. The method of claim 1 wherein the forming an electronic product includes applying the covering structure before the separating.

10. The method of claim 1 wherein during the moving by the indexer to the processing location, during the performing the process, and during the moving by the indexer from the processing location, a relative speed between the indexer and the vacuum plate of the tensioner is maintained above a predefined threshold.

11. The method of claim 10 wherein during the moving by the indexer to the processing location, during the performing the process, and during the moving by the indexer from the processing location, the relative speed between the indexer and the vacuum plate of the tensioner is maintained in a linear region of a Stribeck curve.

12. The method of claim 1 wherein the indexer includes and indexer drum, wherein the moving by the indexer includes rotating the indexer drum.

13. The method of claim 12 wherein the indexer drum includes vacuum holes.

14. The method of claim 1 further comprising:
supplying the flexible substrate to a second indexer through a second tensioner with a vacuum plate so that the flexible substrate is transported over the vacuum plate of the second tensioner;
moving by the second indexer, the designated location of the flexible substrate along the transport direction for processing to a second processing location;
stopping the designated location of the flexible substrate at the second processing location;
while the designated location is stopped at the second processing location, performing a second process on the designated location, wherein while the designated location is stopped at the second processing location, moving the vacuum plate of the second tensioner in an opposite direction of the transport direction;
moving by the second indexer, the designated location from the second processing location after the performing the second process.

15. The method of claim 14 wherein the performing the process includes applying an adhesive to the designated location and the performing the second process includes placing the electronic component at the designated location.

16. The method of claim 15 wherein the forming an electronic product includes applying a covering structure to the designated location after the performing the process and the second process, wherein during the moving by the indexer to the processing location, during the performing the process, and during the moving by the indexer from the processing location, a relative speed between the indexer and the vacuum plate of the tensioner is maintained above a predefined threshold.

17. The method of claim 14 further comprising:
supplying the flexible substrate to a third indexer through a third tensioner with a vacuum plate so that the flexible substrate is transported over the vacuum plate of the third tensioner;
moving by the third indexer, the designated location of the flexible substrate along the transport direction for processing to a third processing location;
stopping the designated location of the flexible substrate at the third processing location;
while the designated location is stopped at the third processing location, performing a third process on the designated location, wherein while the designated location is stopped at the third processing location, moving the vacuum plate of the third tensioner in an opposite direction of the transport direction;
moving by the third indexer, the designated location from the third processing location after the performing the third process.

18. The method of claim 14 wherein the performing the process includes applying an adhesive to the designated location and the performing the second process includes placing the electronic component at the designated location, wherein the performing the third process is characterized as performing a curing process of the adhesive at the designated location.

19. The method of claim 1 where the moving of the flexible substrate by the indexer includes linearly moving the flexible substrate by the indexer.

20. The method of claim 1 wherein the electronic component is characterized as an integrated circuit.

21. A method for making an electronic product comprising:
supplying a flexible substrate to an indexer through a tensioner with a vacuum plate so that the flexible substrate is transported over the vacuum plate;
moving by the indexer, a designated location of the flexible substrate along a transport direction for processing to a processing location;
stopping the designated location of the flexible substrate at the processing location;
while the designated location is stopped at the processing location, placing an electronic component on the designated location, wherein while the designated location is stopped at the processing location, moving the vacuum plate of the tensioner in an opposite direction of the transport direction;
moving by the indexer, the designated location from the processing location after the performing the process;
after the moving, forming an electronic product wherein the forming includes separating the web into a plurality of separate structures wherein the electronic product includes a separate structure of the plurality of separate structures with the electronic component.

* * * * *